(12) United States Patent
Morris, III

(10) Patent No.: US 8,736,511 B2
(45) Date of Patent: May 27, 2014

(54) TUNABLE RADIO FRONT END AND METHODS

(75) Inventor: Arthur S. Morris, III, Raleigh, NC (US)

(73) Assignee: Wispry, Inc., Irvine, CA (US)

( * ) Notice: Subject to any disclaimer, the term of this patent is extended or adjusted under 35 U.S.C. 154(b) by 156 days.

(21) Appl. No.: 13/219,343

(22) Filed: Aug. 26, 2011

(65) Prior Publication Data

US 2012/0169565 A1 Jul. 5, 2012

Related U.S. Application Data

(60) Provisional application No. 61/402,267, filed on Aug. 26, 2010.

(51) Int. Cl.
*H01Q 1/50* (2006.01)
*H04B 1/38* (2006.01)
*H04B 7/02* (2006.01)

(52) U.S. Cl.
USPC ................ 343/860; 455/73; 455/77; 455/101

(58) Field of Classification Search
None
See application file for complete search history.

(56) References Cited

U.S. PATENT DOCUMENTS

| | | | |
|---|---|---|---|
| 5,231,407 A | 7/1993 | McGirr et al. | |
| 6,061,024 A | 5/2000 | McGirr et al. | |
| 6,333,719 B1 | 12/2001 | Varadan | |
| 6,735,418 B1 | 5/2004 | MacNally et al. | |
| 7,035,611 B2 | 4/2006 | Garlepp et al. | |
| 7,116,952 B2 | 10/2006 | Arafa | |
| 7,283,793 B1 * | 10/2007 | McKay | 455/83 |
| 7,446,628 B2 | 11/2008 | Morris | |
| 7,865,149 B2 * | 1/2011 | Han et al. | 455/73 |
| 8,073,400 B2 * | 12/2011 | Gorbachov | 455/83 |
| 8,106,848 B2 * | 1/2012 | Rofougaran | 343/860 |
| 8,170,510 B2 | 5/2012 | Knudsen | |
| 8,311,496 B2 * | 11/2012 | Rofougaran | 455/118 |
| 2001/0017602 A1 * | 8/2001 | Hieb | 343/843 |
| 2002/0140612 A1 | 10/2002 | Kadambi | |
| 2002/0183013 A1 | 12/2002 | Auckland | |

(Continued)

FOREIGN PATENT DOCUMENTS

| | | |
|---|---|---|
| KR | 2005 0069746 | 7/2005 |
| WO | WO 2007-025309 | 3/2007 |
| WO | WO 2012/027703 | 3/2012 |

OTHER PUBLICATIONS

International Search Report and Written Opinion for PCT/US2011/049410 dated Feb. 21, 2012.

(Continued)

*Primary Examiner* — Trinh Dinh
(74) *Attorney, Agent, or Firm* — Jenkins, Wilson, Taylor & Hunt, P.A.

(57) ABSTRACT

Tunable radio front end systems and methods are disclosed in which the tunable radio front end includes a first tunable impedance matching network, a second tunable impedance matching network, a transmission signal path, and a reception signal path. The transmission signal path can include a first tunable filter in communication with the first tunable impedance matching network, a tunable power amplifier connected to the first tunable filter, and a radio transmitter connected to the tunable power amplifier. The reception signal path can include a second tunable filter in communication with the second tunable impedance matching network, a tunable low-noise amplifier connected to the second tunable filter, and a radio receiver connected to the tunable low-noise amplifier.

15 Claims, 9 Drawing Sheets

(56) References Cited

U.S. PATENT DOCUMENTS

| | | | |
|---|---|---|---|
| 2004/0087341 | A1 | 5/2004 | Edvardsson |
| 2004/0127178 | A1 | 7/2004 | Kuffner |
| 2005/0057399 | A1 | 3/2005 | Kipnis |
| 2005/0164647 | A1 | 7/2005 | Shamsaifar |
| 2006/0217082 | A1 | 9/2006 | Fischer |
| 2008/0107093 | A1 | 5/2008 | Meiyappan et al. |
| 2008/0122723 | A1* | 5/2008 | Rofougaran ............ 343/861 |
| 2009/0096517 | A1 | 4/2009 | Huang et al. |
| 2009/0231220 | A1* | 9/2009 | Zhang et al. ............ 343/722 |
| 2009/0267851 | A1* | 10/2009 | Morris, III ............ 343/745 |
| 2010/0053018 | A1* | 3/2010 | Rofougaran ............ 343/859 |
| 2010/0225543 | A1* | 9/2010 | Kakitsu et al. ............ 343/702 |

OTHER PUBLICATIONS

U.S. Appl. No. 12/431,373, filed Apr. 28, 2009.

Notice of Publication for Serial No. PCT/US2011/049410 dated Mar. 1, 2012.

Rowell, "A Capacitively Loaded PIFA for Compact Mobile Telephone Handsets," IEEE Transactions on Antennas and Propagation, May 1997, vol. 45, No. 5.

Nishio et al., "A Study of Wideband Built-In Antenna Using RF-MEMS Variable Capacitor for Digital Terrestrial Broadcasting," Antennas and Propag. Soc. Int'l Symposium 206, IEEE Jan. 1, 2006—ISBN: 978-1-4244-0123-9.

Non-Final Office Action for U.S. Appl. No. 12/431,373 dated Aug. 3, 2011.

European Search Report/Office Action for EP Appl. No. 09739590.9 dated Nov. 7, 2011.

Final Office Action for U.S. Appl. No. 12/431,373 dated Feb. 9, 2012.

International Search Report and Written Opinion for PCT/US2011/064459 dated Aug. 22, 2012.

Non-Final Office Action for U.S. Appl. No. 12/431,373 dated Oct. 2, 2012.

Chinese Office Action for Application No. 200980113013.7 dated Dec. 5, 2012.

Final Office Action for U.S. Appl. No. 12/431,373 dated Feb. 15, 2013.

Advisory Action for U.S. Appl. No. 12/431,373 dated Apr. 25, 2013.

Chinese Office Action for Application No. 2009801130137 dated Aug. 2, 2013.

Non-Final Office Action for U.S. Appl. No. 12/431,373 dated Sep. 26, 2013.

"Wireless Demands Focus Designers on Integration," Nancy Friedrich, Microwaves and RF, Feb. 19, 2010.

"Reconfigurable Antennas and Rf Front Ends for Portable Wireless Devices," David T. Auckland et al. Proceeding of the SDR 02 Technical Conference and Product Exposition.

* cited by examiner

TUNABLE RADIO FRONT END AND METHODS

RELATED APPLICATIONS

The presently disclosed subject matter claims the benefit of and priority to U.S. Provisional Patent Application Ser. No. 61/402,267, filed Aug. 26, 2010, the disclosure of which is incorporated herein by reference in its entirety.

TECHNICAL FIELD

The subject matter disclosed herein relates generally to systems and methods for use in communications antennas. More particularly, the subject matter disclosed herein relates to configurations and methods for a front end or a radio frequency (RF) antenna.

BACKGROUND

The increased diversity in the functionality of mobile phones has resulted in an increase in the complexity of the design of these devices. Specifically, for example, increased mobile phone functions such as dual mode (e.g., a combination of an analog mode and a digital mode, or a combination of digital modes, such as TDMA or CDMA), dual band (e.g., a combination of an 800 MHz band and a 1.9 GHz band, or a combination of a 900 MHz band and a 1.8 GHz band or a 1.5 GHz band), and multiple bands (e.g., those previously mentioned plus 3 G UMTS, 4 G LTE) have been increasing the complexity of mobile phone RF architecture and circuitry. Furthermore, constraints on physical space available for the antenna or antennas can limit antenna bandwidth, which is the range of frequencies over which the antenna can operate with acceptable efficiency and power transfer. Conversely, the increased frequency ranges needed for multi-mode phones increase the need for performance over a number of frequency channels, or a wide bandwidth antenna. Moreover, to support these multiple, diverse functions while maintaining proper isolation and reliable signal transfer between transmitter and receiver, present communication devices use multiple sets of fixed circuitry, such as an increased quantity of switches, filters, power amplifiers, and duplexers to customize the device capabilities for each mode of operation. Accordingly, such increased use and quantity of components creates the need for optimizing the performance of the components used as well as different solutions that avoid the proliferation of hardware and provide a more scalable solution In this regard, there is a continuing demand for component reduction and high performance communications devices. Elimination of redundant components, functions, or circuitry is highly desired in communication electronics, as is increased performance without increasing device size or weight. Further, there is a continuing need for reliable and quality signal transfer, improved transmitter-receiver isolation, and very high Q value circuitry with respect to duplexers. In addition, further considerations include polarization, tradeoffs between isolation and size, tuning precision, and transmit/receive frequency spacing for a given band versus wholesale tuning between bands.

SUMMARY

In accordance with this disclosure, configurations and methods for radio frequency (RF) front end and antenna systems are provided. In one aspect, a tunable radio front end is provided and can comprise a first tunable impedance matching network, a second tunable impedance matching network, a transmission signal path, and a reception signal path. Each of the first tunable impedance matching network and the second tunable impedance matching network can comprise a tunable antenna and one or more tunable capacitors. The transmission signal path can comprise a first tunable filter in communication with the first tunable impedance matching network, a tunable power amplifier connected to the first tunable filter, and a radio transmitter connected to the tunable power amplifier. The reception signal path can comprise a second tunable filter in communication with the second tunable impedance matching network, a tunable low-noise amplifier connected to the second tunable filter, and a radio receiver connected to the tunable low-noise amplifier.

In another aspect, a method for operating a radio frequency (RF) antenna can comprise connecting a first tunable impedance matching network to a radio transmitter through a transmission signal path, the transmission signal path comprising a first tunable filter and a first tunable power amplifier, and connecting a second tunable impedance matching network to a radio receiver through a reception signal path, the reception signal path comprising a second tunable filter and a first tunable low-noise amplifier. The method can further comprise adjusting tuning settings of the first tunable impedance matching network, the first tunable filter, and the first tunable power amplifier to pass signals of a desired transmit frequency band from the radio transmitter and block signals of a desired receive frequency band, and adjusting tuning settings of the second tunable impedance matching network, the second tunable filter, and the first tunable low-noise amplifier to pass signals of the desired receive frequency band to the radio receiver and blocking signals of the desired transmit frequency band.

Although aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides configurations and methods for a front end or a radio frequency (RF) antenna. In one aspect, the present subject matter provides a tunable radio front end. Rather than adding specialized, static, and expensive RF components, such as multiple antennas with corresponding signal paths, an integrated front end can provide a comparatively compact, agile design that can simplify the antenna construction without compromising performance relative to existing configurations.

Figure 1:
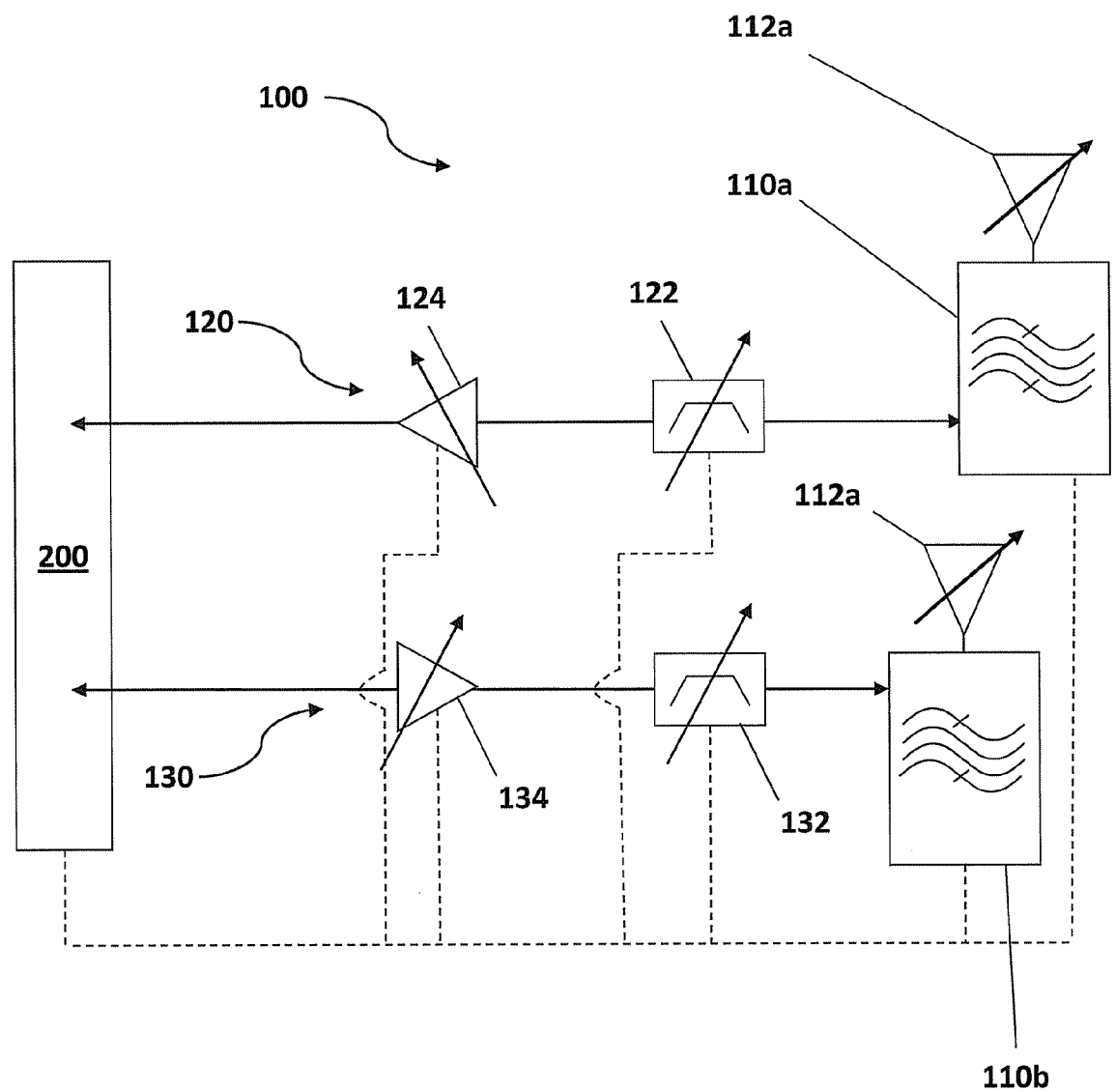
FIG. 1 is a schematic drawing of a tunable radio front end according to an embodiment of the presently disclosed subject matter.

In one configuration shown in FIG. 1, for example, a tunable radio front end, generally designated 100, can comprise a first tunable impedance matching network (generally designated 110a), a second tunable impedance matching network (generally designated 110b), a transmission signal path (generally designated 120) connecting first tunable impedance matching network 110a to a transceiver and baseband control unit (generally designated 200), and a reception signal path (generally designated 130) that connects second tunable impedance matching network 110b to transceiver and baseband control unit 200. Specifically, transmission signal path 120 can connect first tunable impedance matching network 110a to a radio transmitter that is integrated or in communication with transceiver and baseband control unit 200, and reception signal path 130 can connect second tunable impedance matching network 110b to a radio receiver that is integrated or in communication with transceiver and baseband control unit 200. This separation of transmitted and received signals when combined with the tunability of the individual signal paths allows operation to be optimized for each path.

Figure 2:
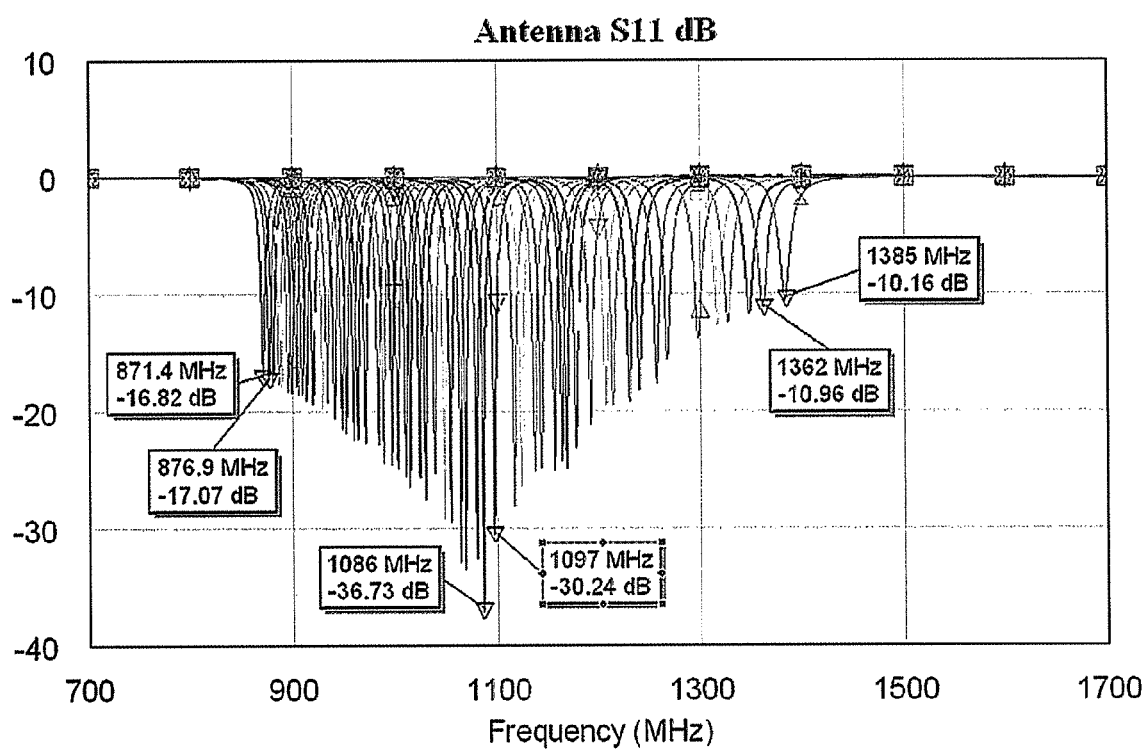
FIG. 2 is a graph of the tuning range of a tunable antenna for use with a tunable radio front end according to an embodiment of the presently disclosed subject matter.

First tunable impedance matching network 110a can comprise one or more first tunable antennas 112a (e.g., one or more distributed ultra-small tunable antennas) and one or more second tunable capacitors, and second tunable impedance matching network 110b can likewise comprise one or more tunable antennas 112b and one or more tunable capacitors. First and second tunable antennas 112a and 112b can be tunable to cover a wide range of bandwidths as shown in FIG. 2, but because of the tunability of the system, they can be configured for narrowband operation. As a result, first and second tunable antennas 112a and 112b can exhibit very low loss compared to existing configurations and can provide a portion (e.g., about 20-30 dB) of the desired isolation between transmission and reception. First and second tunable antennas 112a and 112b can be arranged with respect to one another in any of a variety of configurations known to those having skill in the art, examples of which are disclosed in co-pending U.S. Patent Application Ser. No. 12/431,373, the disclosure of which is incorporated herein in its entirety.

Figure 3:
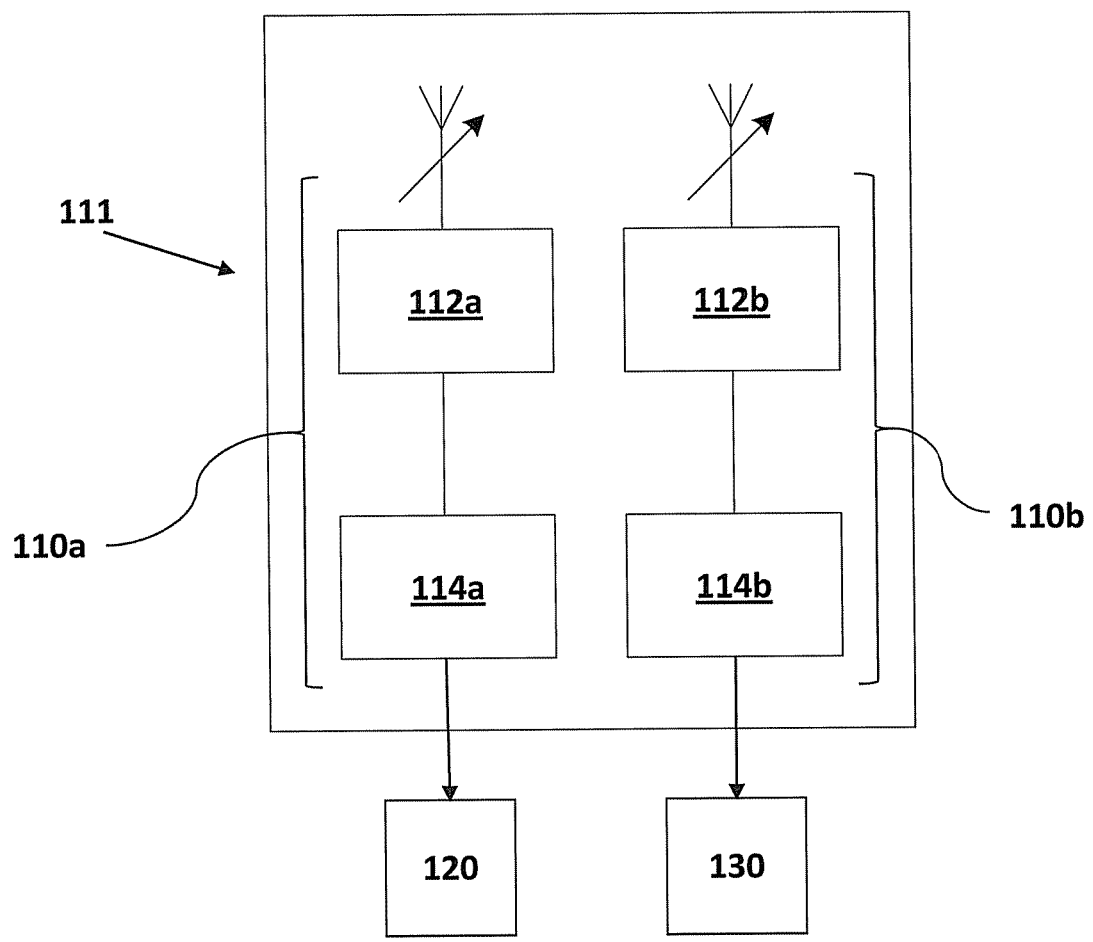
FIG. 3 is a schematic drawing of a tunable impedance matching network module for use with a tunable radio front end according to an embodiment of the presently disclosed subject matter.

For example, referring to FIG. 3, first and second tunable impedance matching networks 110a and 110b can be arranged in a tunable impedance matching network module 111. It should be recognized, however, that first and second tunable matching networks 110a and 110b need not be arranged in a single footprint, but rather can be configured in any of a variety of arrangements. For example, first tunable impedance matching network 110a and transmission signal path 120 can be arranged such that they are completely separate from second tunable impedance matching network 110b and reception signal path 120 (e.g., opposite corners of a phone). In such an arrangement, the only coupling between the components can be through antenna near- and far-field coupling and/or through a ground plane of the phone.

Regardless of their specific arrangement, first tunable impedance matching network 110a can comprise first antenna 112a in communication with transmission signal path 120 and second tunable impedance matching network 110b can comprise second antenna 112b in communication with reception signal path 130. First tunable impedance matching network 110a can further comprise a tunable transmission filter 114a (e.g., a harmonic filter and/or matching network, if required) in communication with first antenna 112a, and second tunable impedance matching network 110b can include a tunable reception filter 114b (e.g., a TX filter and/or matching network, if required) in communication with second antenna 112b, each of which being integrated with a respective one of first or second tunable impedance matching networks 110a or 110b (i.e., separate from components of transmission signal path 120 and reception signal path 130, respectively). First tunable impedance matching network 110a and second tunable impedance matching network 110b can define separate paths for the transmission and reception of signals, although some configurations can provide carefully induced coupling to cancel radiative cross-talk. First and second antennas 112a and 112b can be tuned to address multiple frequency bands, and can be tuned to adjust frequency spacing between the elements. For example, a distance between the first and second antennas can be less than about ¼ of a free-space wavelength, and/or first and second antennas 112a and 112b can be sized less than about ¼ of a free-space wavelength. Further, first and second antennas 112a and 112b can be co-polarized.

As a result, first and second tunable impedance matching networks 110a and 110b of the types shown in FIG. 3 can be smaller than a full-band antenna and much smaller than multi-band antenna. In particular, more than two tunable antennas can be configured to fit into a volume of an existing fixed antenna. In addition, if two antennas with individual feeds are closely spaced but tuned to slightly different frequencies, there will be substantial isolation between the ports. As a result, first and second tunable impedance matching networks 110a and 110b can provide a number of advantages over current duplexer designs. Specifically, first and second tunable impedance matching networks 110a and 110b can combine the functions of an antenna, a duplexer, a matching network, and/or filters. Further, first and second tunable impedance matching networks 110a and 110b can produce lower insertion losses by optimizing matches (e.g. about 1 dB), improving antenna efficiency (e.g., about 0.5 dB), and eliminating duplexer losses (e.g., about 3 dB).

Regardless of the specific configuration, however, first and second tunable impedance matching networks 110a and 110b can provide a number of advantageous features to tunable radio front end 100. Specifically, for example, first and second tunable impedance matching networks 110a and 110b can provide a platform for broadband dynamic impedance matching without switching losses, it can operate in a broad frequency range (e.g., about 832 MHz-2170 MHz), its flexible architecture can support multiple matching network implementations, it can provide precise digital control of capacitor networks (e.g., with step resolution of about 125 fF), comparatively short network reconfiguration times (e.g., about 100 µs), and low current consumption (e.g., less than about 100 µA while active, less than about 6 µA while in a sleep state). In the context of an RF antenna specifically, first and second tunable impedance matching networks 110a and 110b can provide antenna matching for hand and head positioning, compensation for different antenna models, and dynamic compensation for phone use modes.

Referring again to the arrangement shown in FIG. 1, first and second tunable impedance matching networks 110a and 110b can be connected in communication with a transmission signal path 120 and a reception signal path 130, respectively, as discussed above. Because transmission signal path 120 and reception signal path 130 are kept separate, the impedances of the components in each respective path can be particularly chosen for optimal operation and can adapt to the power level and frequency of operation.

Transmission signal path 120 can comprise one or more first tunable filter 122 in communication with first tunable impedance matching network 110a. First tunable filter 122 can be used for impedance matching and filtering and can provide further isolation of transmission signal path 120 from reception signal path 130 (e.g., providing a contribution of about 25 dB when taken together with corresponding elements on reception signal path 130). In particular, for example, first tunable filter 122 can comprise tunable interference and harmonic filters, which can further include integrated transformers. Such filters can comprise one or more pole-zero elements, such as the elements disclosed in U.S. Pat. No. 7,446,628, the disclosure of which is incorporated herein in its entirety.

Figure 4A:
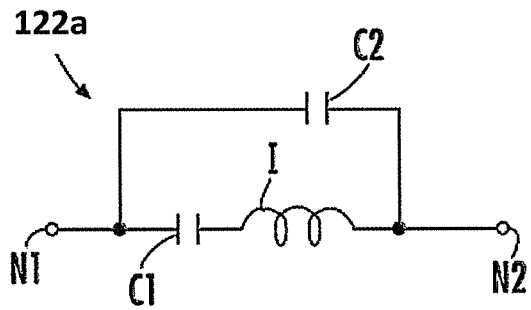
FIGS. 4A through 4D are schematic diagrams of exemplary pole-zero elements for use with a tunable radio front end according to an embodiment of the presently disclosed subject matter.

Specifically, for example, first tunable filter 122 can comprise one or more pole-zero elements such as those illustrated in FIGS. 4A through 4D. Referring to FIG. 4A, a first pole-zero element 122a can comprise an inductor I and capacitors C1 and C2. Inductor I can be connected in a series arrangement with capacitor C1. The series arrangement of inductor I and capacitor C1 can be connected in parallel with capacitor C2 at nodes N1 and N2. Pole-zero element 100 can be included in first tunable filter 122 for passing signals of a transmit frequency band and blocking signals of a receive frequency band. Further, one or more first pole-zero element 122a can also be connected in a series arrangement to result in higher orders of filtering. For example, the impedance magnitude for first pole-zero elements 122a can be much less than z0 at a transmission frequency. The impedance magnitude for first pole-zero elements 122a can be greater than or about equal to z0 at a reception frequency.

Figure 4B:
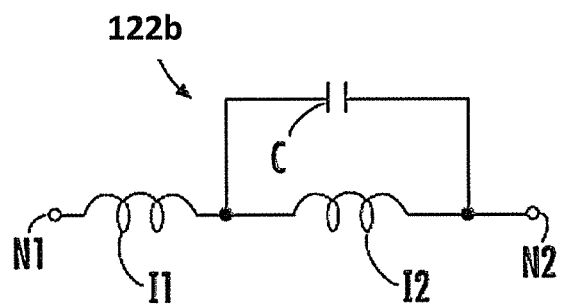

Referring to FIG. 4B, a second pole-zero element 122b can comprise a capacitor C and inductors I1 and I2. Capacitor C and inductor I2 can be connected in a parallel arrangement. The parallel arrangement of capacitor C and inductor I2 are connected in series with inductor I1 across nodes N1 and N2. Second pole-zero element 122b can be included in first tunable filter 122 for passing signals of a transmit frequency band and blocking signals of a receive frequency band. Further, one or more second pole-zero element 122b can also be connected between ground and the signal path between the transmission circuit and the antenna for resulting in higher orders of filtering. For example, the impedance magnitude for second pole-zero element 122b can be much greater than z0 at the transmission frequency. The impedance magnitude for second pole-zero element 122b can be less than or about equal to z0 at the reception frequency.

Figure 5:
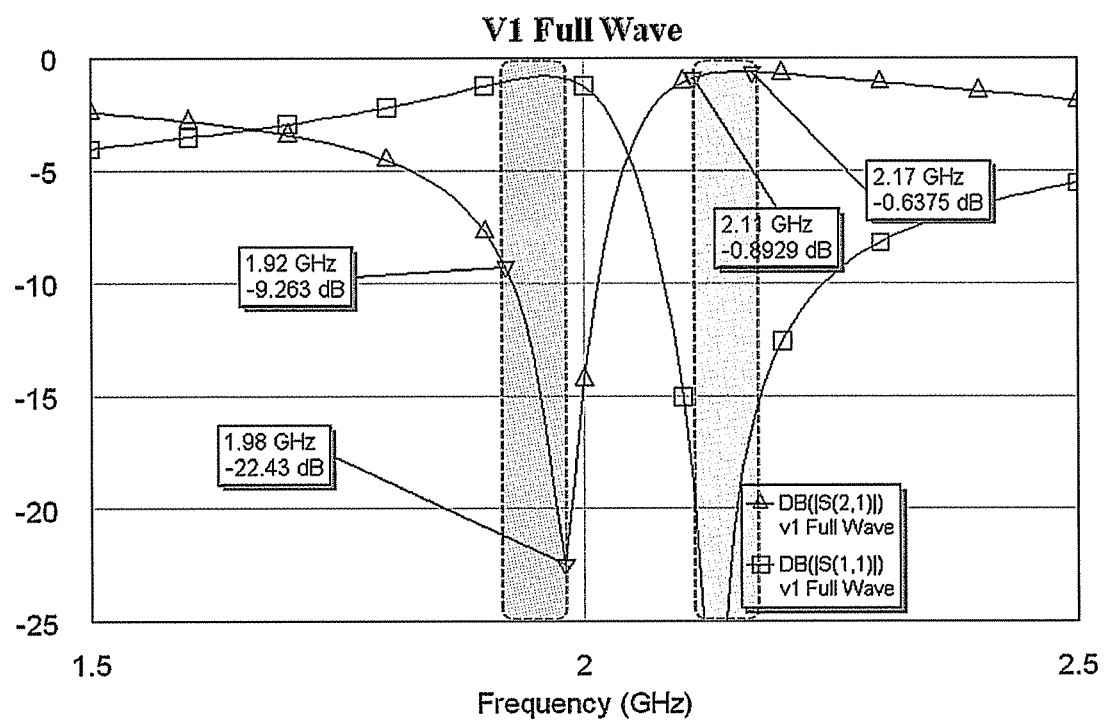
FIG. 5 is a schematic drawing of a tunable radio front end according to another embodiment of the presently disclosed subject matter.

Regardless of the specific configuration, first tunable filter 122 that incorporates such elements can provide tunable filtering for transmission signal path 120 with low insertion loss (e.g., about 0.7 dB). In addition, as shown in FIG. 5, first tunable filter 122 can exhibit sharp frequency cutoffs and high isolation between signal paths.

Transmission signal path 120 can further comprise a first tunable power amplifier 124 connected between first tunable filter 122 and transceiver and control unit 200. The narrowband tunability of each signal path can allow first tunable power amplifier 124 to roll off at a desired frequency, reducing noise, improving linearity and efficiency, and helping to provide additional isolation of transmission signal path 120 from reception signal path 130 (e.g., providing a contribution of about 5 dB when taken together with corresponding elements on reception signal path 130). First tunable power amplifier 124 can be used to modify the output match over the power range, maintain proper harmonic terminations, and maintain efficiency over a wide range of operating conditions.

Reception signal path 130 can comprise a second tunable filter 132 in communication with second tunable impedance matching network 110b. Similarly to first tunable filter 122 discussed above, second tunable filter 132 can be used for impedance matching and filtering and can contribute to the isolation of transmission signal path 120 from reception signal path 130.

Figure 4C:
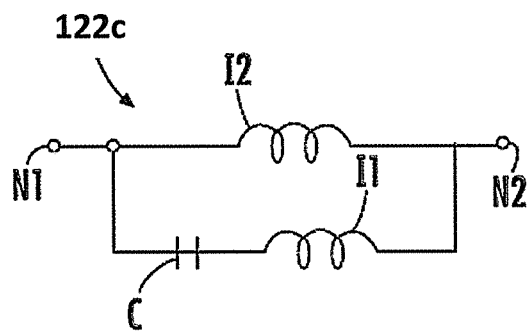

In some embodiments, second tunable filter 132 can comprise one or more tunable interference and harmonic filters, which can include one or more pole-zero elements. For example, second tunable filter 132 can comprise pole-zero elements such as those disclosed in U.S. Pat. No. 7,446,628. Referring to FIG. 4C, a third pole-zero element 132a can include a capacitor C and inductors I1 and I2. Capacitor C can be connected in a series arrangement with inductor I1. The series arrangement of capacitor C and inductor I1 can be connected in parallel with inductor I2 at nodes N1 and N2. Third pole-zero element 132a can be included in second tunable filter 132 for passing signals of a receive frequency band and blocking signals of a transmit frequency band. Further, one or more of third pole-zero element 132a may also be connected in a series arrangement to result in higher orders of filtering. For example, the impedance magnitude for third pole-zero element 132a can be much less than z0 at a reception frequency. The impedance magnitude for third pole-zero element 132a can be greater than or about equal to z0 at a transmission frequency.

Figure 4D:
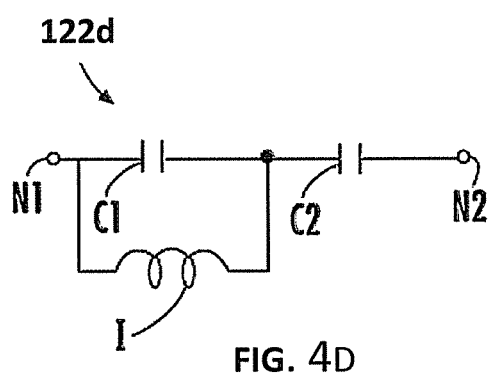

Referring to FIG. 4D, a fourth pole-zero element 132b can comprise an inductor I and capacitor C1 and C2. Capacitor C1 and inductor I can be connected in a parallel arrangement. The parallel arrangement of capacitor C1 and inductor I can be connected in series with capacitor C2 across nodes N1 and N2. Fourth pole-zero element 132b can be included in second tunable filter 132 for passing signals of a receive frequency band and blocking signals of a transmit frequency band. Further, one or more of fourth pole-zero element 132b can also be connected between the ground and the signal path between the reception circuit and the antenna for resulting in higher orders of filtering. For example, the impedance magnitude for fourth pole-zero element 132b can be much greater than z0 at the reception frequency. The impedance magnitude for fourth pole-zero element 132b can be less than or about equal to z0 at the transmission frequency.

Reception signal path 130 can further comprise a first tunable low-noise amplifier 134 connected between second tunable filter 132 and transceiver and control unit 200. Again, the narrowband tunability of each signal path can allow first tunable low-noise amplifier 134 to roll off at a desired frequency, thereby contributing to the signal isolation and improving blocker performance for low current.

With tunable radio front end 100 having a configuration such as that disclosed above, tuning of tunable radio front end 100 can be accomplished without any complex or inefficient switching mechanism. Rather, tuning of tunable radio front end 100 can be accomplished by adjusting tuning settings of first and second tunable impedance matching networks 110a and 110b and the tunable components of transmission signal path 120 and reception signal path 130. Specifically, for example, transmission signal path 120 can be configured to pass signals of a desired transmit frequency band and block signals of a desired receive frequency band by adjusting tuning settings of first tunable impedance matching network 110a (e.g., adjusting tuning settings of first antenna 112a and tunable transmission filter 114a), first tunable filter 122, and first tunable power amplifier 124. Similarly, reception signal path 130 can be configured to pass signals of the desired receive frequency band and block signals of the desired transmit frequency band by adjusting tuning settings of second tunable impedance matching network 110b (e.g., adjusting tuning settings of second antenna 112b and tunable reception filter 114b), second tunable filter 132, and first tunable low-noise amplifier 134.

Figure 6:
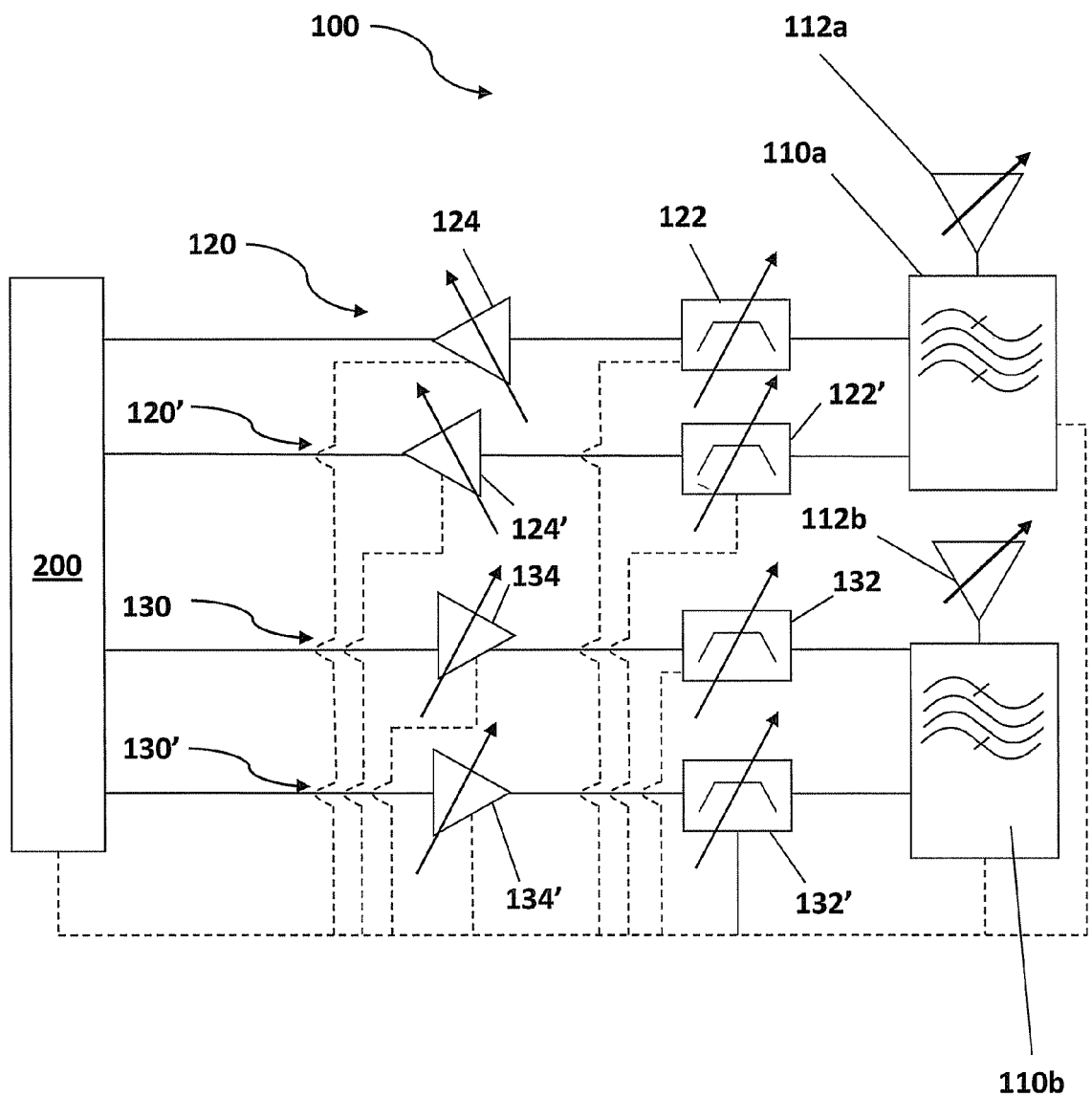
FIG. 6 is a schematic drawing of a tunable radio front end according to yet another embodiment of the presently disclosed subject matter.
Figure 7A:
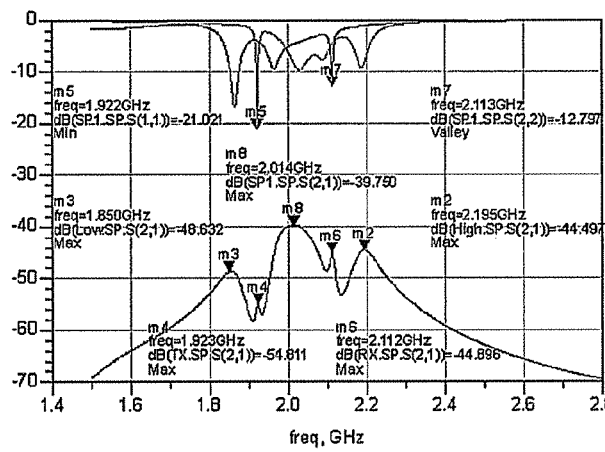
FIGS. 7A through 7F are graphs of the overall response of a tunable radio front end for operation in UMTS Band I according to an embodiment of the presently disclosed subject matter.
Figure 7B:
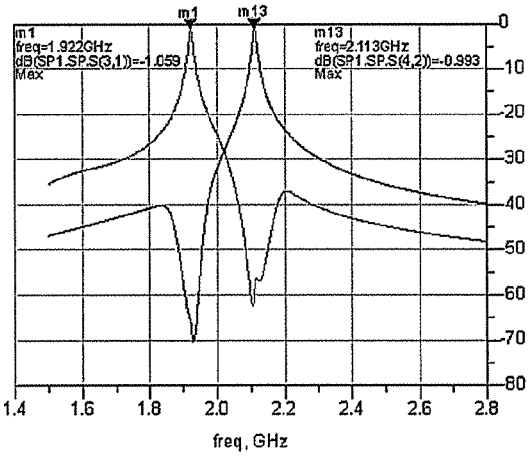
Figure 7C:
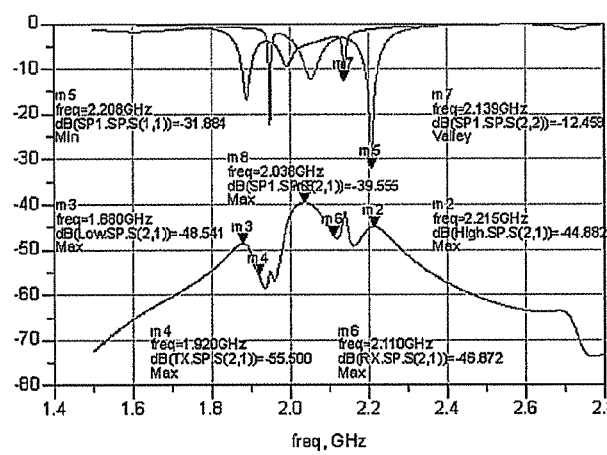
Figure 7D:
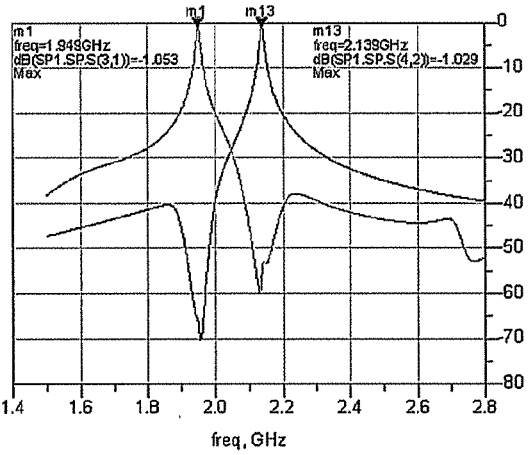
Figure 7E:
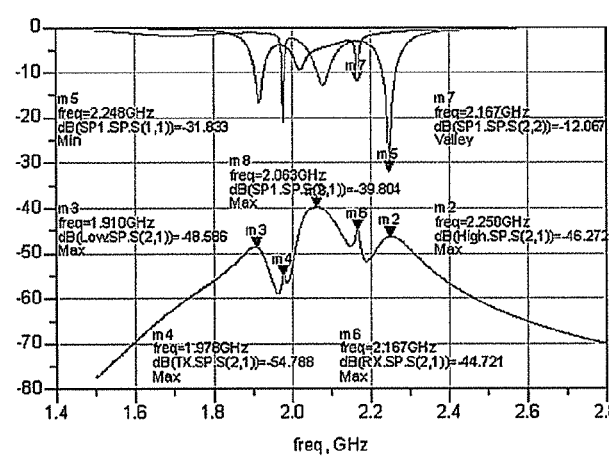
Figure 7F:
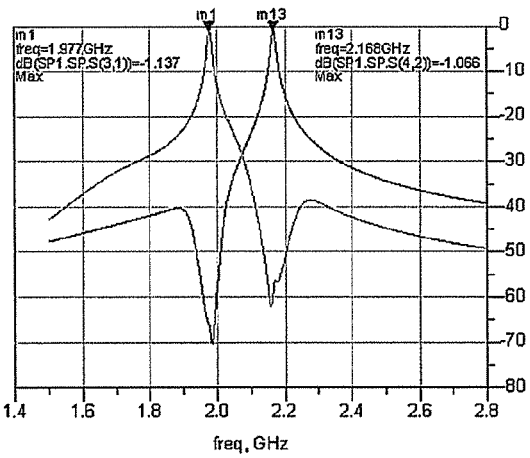
Figure 8A:
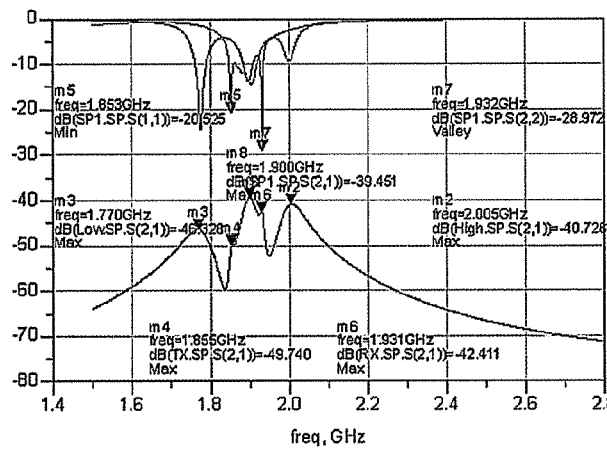
FIGS. 8A through 8F are graphs of the overall response of a tunable radio front end for operation in UMTS Band II according to an embodiment of the presently disclosed subject matter.
Figure 8B:
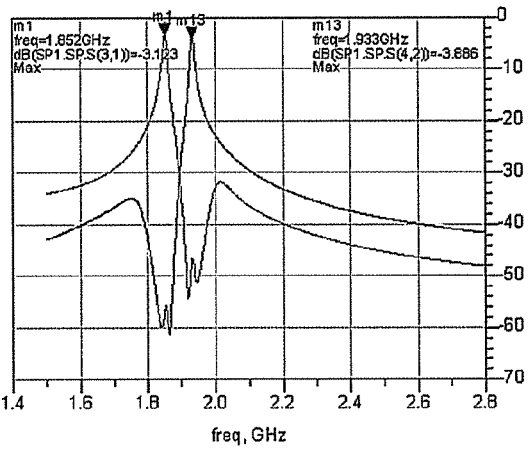
Figure 8C:
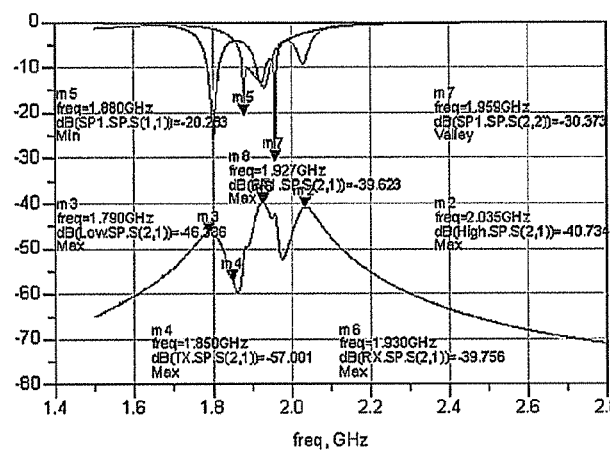
Figure 8D:
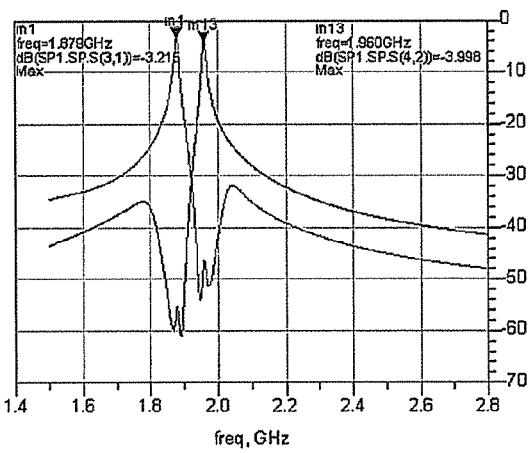
Figure 8E:
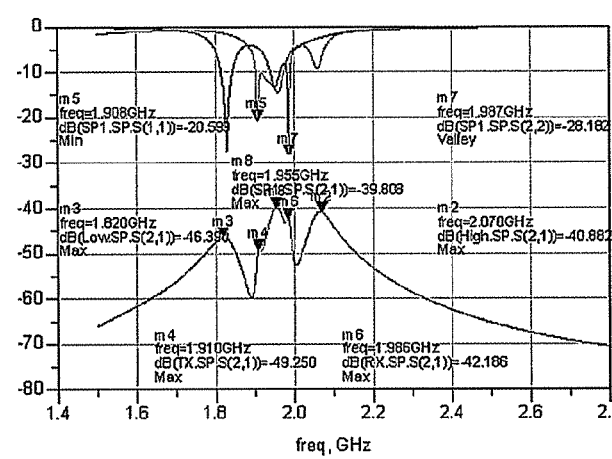
Figure 8F:
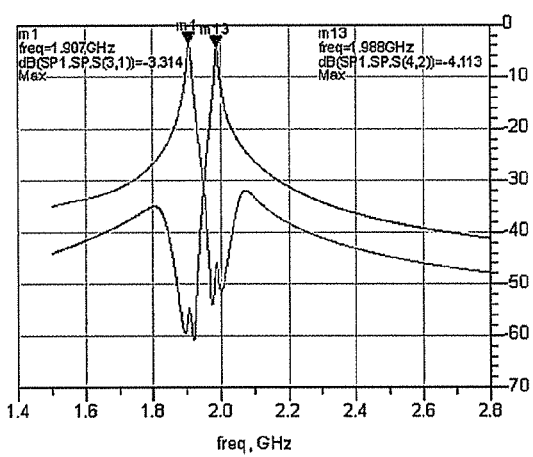
Figure 9A:
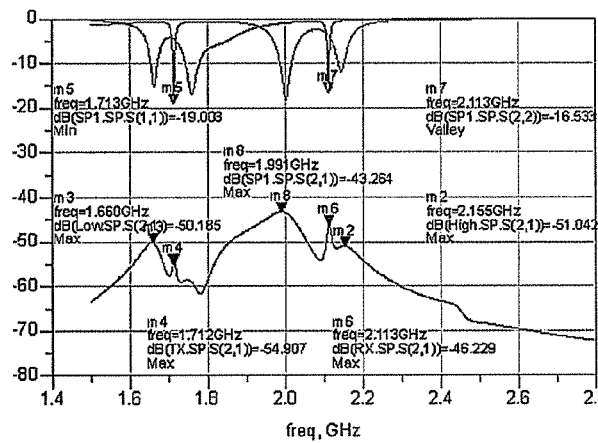
FIGS. 9A through 9F are graphs of the overall response of a tunable radio front end for operation in UMTS Band IV according to an embodiment of the presently disclosed subject matter.
Figure 9B:
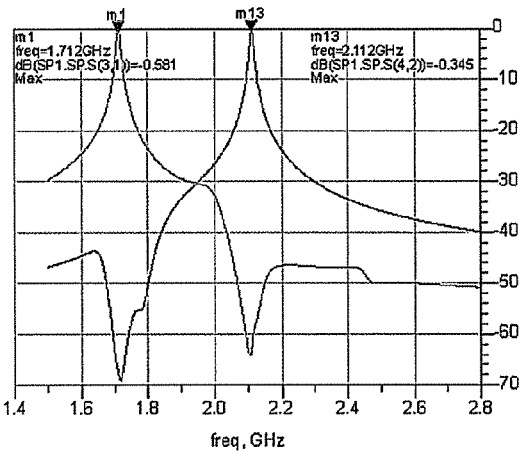
Figure 9C:
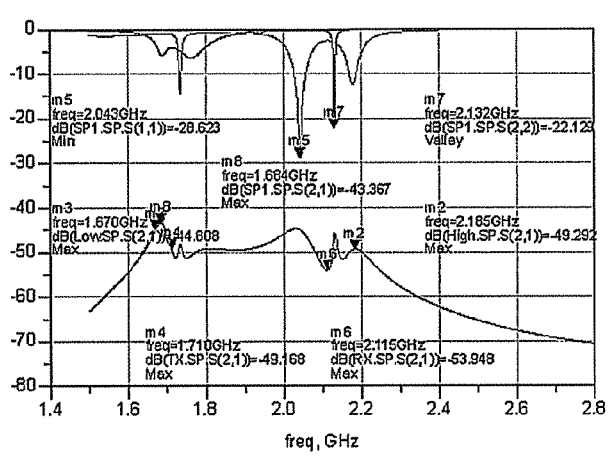
Figure 9D:
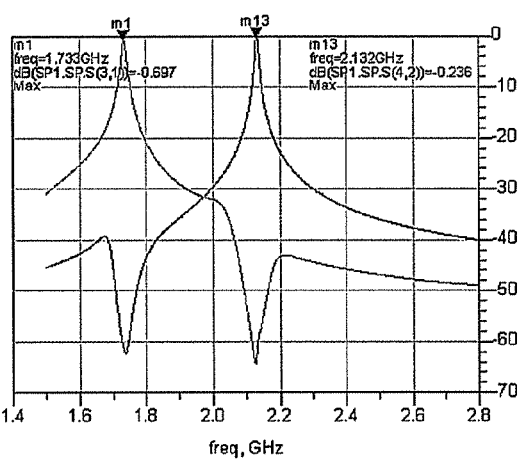
Figure 9E:
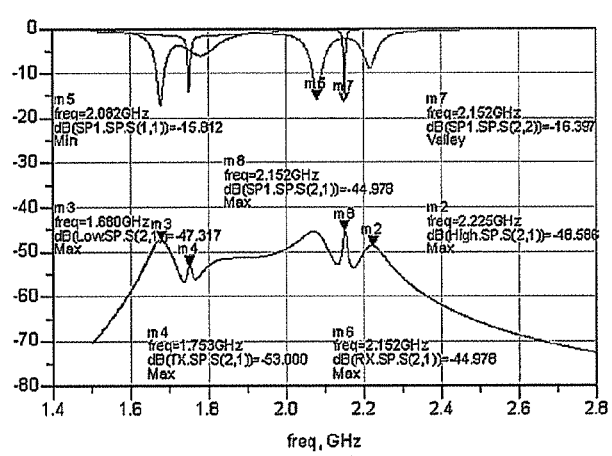
Figure 9F:
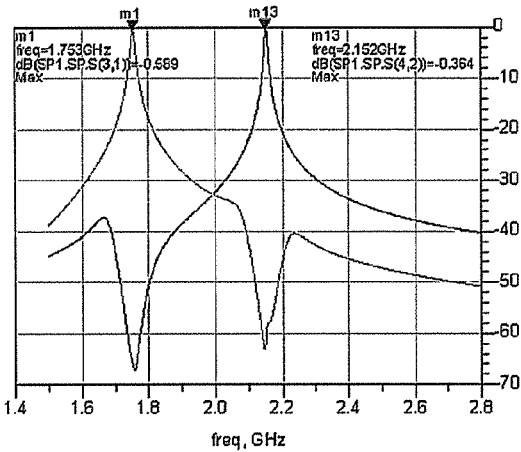

To more easily and effectively control tunable radio front end 100, one or more of the tunable components can be connected with transceiver and control unit 200 as shown in FIGS. 1, 6, and 7, or they can be connected to a separate sensing and control system for integrated sensing and control of the frequency response of tunable radio front end 100.

It is noted that FIG. 1 shows tunable radio front end 100 as having a single transmission signal path 120 and a single reception signal path 130. It should be recognized, however, that at least one additional transmission signal path 120' and/or at least one additional reception signal path 130' can be provided. Specifically, for example, in the configuration shown in FIG. 6, tunable radio front end 100 can further comprise at least one additional transmission signal path 120' having a third tunable filter 122' and a second tunable power amplifier 124'. Although FIG. 6 illustrates at least one additional transmission signal path 120' being connected in communication with first tunable impedance matching network 110a in common with transmission signal path 120, a person having ordinary skill in the art will recognize that it can alternatively be connected in communication with a separate tunable impedance matching network.

In either configuration, transmission signal path 120 can be configured for transmission of signals within a first transmission frequency band (e.g., a relatively lower frequency band between about 600 and 1000 MHz), whereas the at least one additional transmission signal path 120' can be configured for transmission of signals within a second transmission frequency band (e.g., a relatively higher frequency band between about 1700 and 3500 MHz). In particular, the tuning settings of first tunable impedance matching network 110a and of the tunable components of each of transmission signal path 120 and at least one additional transmission signal path 120' can be adjusted to differentiate the signals passed by each path. Separating the transmission signal between high- and low-band paths in this way can help to simplify the circuit design and minimize costs.

Alternatively, transmission signal path 120 can be configured for transmission of signals associated with a first transmission standard (e.g., multi-band GSM), whereas the at least one additional transmission signal path 120' can be configured for transmission of signals associated with a second transmission standard (e.g., multi-band CDMA).

Likewise, tunable radio front end 100 can further comprise at least one additional reception signal path 130' having a fourth tunable filter 132' and a second tunable low-noise amplifier 134'. At least one additional reception signal path 130' can be connected in communication with second tunable impedance matching network 110b in common with reception signal path 130 as shown in FIG. 6, or it can be connected in communication with a separate tunable impedance matching network. Regardless of the specific configuration, reception signal path 130 can be configured for reception of signals within a first reception frequency band (e.g., a relatively lower frequency band between about 600 and 1000 MHz), and the at least one additional reception signal path 130' can be configured for reception of signals within a second reception frequency band (e.g., a relatively higher frequency band between about 1700 and 3500 MHz). Alternatively, reception signal path 130 and at least one additional reception signal path 130' can be configured for transmission of signals associated with different transmission standards as indicated above. In either case, the tuning settings of second tunable impedance matching network 110b and of the tunable components of each of reception signal path 130 and at least one additional reception signal path 130' can be adjusted to differentiate the signals passed by each path.

Regardless of the specific numbers of signal paths or configuration thereof, the combination of first tunable impedance matching networks 110a and 110b with the tunable components of transmission signal path 120 (e.g., first tunable filter 122, first tunable power amplifier 124) and reception signal path 130 (e.g., second tunable filter 132, first tunable low-noise amplifier 134) can provide a complete front-end system. It is recognized that each element individually can be used to isolate transmitted and received signals, but neither can alone provide the same total isolation and performance that the complete tunable radio front end 100 can provide.

Specifically, for example, the antenna tuners and matching networks of first and second tunable impedance matching networks 110a and 110b can provide improved total radiated power (TRP)/total isotropic sensitivity (TIS) at lower power consumption, but first and second tunable impedance matching networks 110a and 110b alone cannot achieve the level of isolation desired for an RF antenna. Conversely, tunable filters and duplexers can provide frequency agility and dynamic interferer suppression, and tunable power amplifiers can exhibit high power-added efficiency (PAE) and multi-mode performance, but these components alone would require greater complexity than the present tunable radio front end 100 to achieve the same performance characteristics, which in turn can lead to higher losses and difficulty in design and fabrication.

When integrated into a complete system as discussed herein, however, tunable radio front end 100 can provide low insertion loss and high isolation when used in a frequency-division duplexing (FDD) scheme. Specifically, for example, FIGS. 7A through 7F illustrate the predicted response for tunable radio front end 100 over high, medium, and low channels for UMTS Frequency Band I, FIGS. 8A through 8F illustrate the predicted response over three channels within Band II, and FIGS. 9A through 9F illustrate the predicted response over three channels within Band IV. As can be seen in these results, tunable radio front end 100 can provide improved performance for use in FDD systems (e.g., CDMA, WCDMA, and LTE) relative to existing technologies.

Alternatively, tunable radio front end 100 can be configured to operate in a time-division duplexing (TDD) scheme by tuning the filters (e.g. first tunable filter 122 and second tunable filter 132) to a low-loss state with very little isolation. In this configuration, the antenna isolation itself can be sufficient to protect the receiver from the transmitter since they are not active at the same time. In this way, although the advantages of simultaneous transmission and reception are forfeited, the switches that are conventionally required for TDD systems (e.g., GSM, GPRS, and EDGE) can be eliminated, thereby providing performance improvements over existing technologies.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A tunable radio front end comprising:
   a first tunable impedance matching network;
   a second tunable impedance matching network;
   a transmission signal path comprising a first tunable filter in communication with the first tunable impedance matching network, a first tunable power amplifier connected to the first tunable filter, and a radio transmitter connected to the first tunable power amplifier; and
   a reception signal path comprising a second tunable filter in communication with the second tunable impedance matching network, a first tunable low-noise amplifier connected to the second tunable filter, and a radio receiver connected to the first tunable low-noise amplifier.

2. The tunable radio front end of claim 1, wherein the each of the first tunable impedance matching network and the second tunable impedance matching network comprises a tunable antenna and one or more tunable capacitors.

3. The tunable radio front end of claim 2, wherein each of the tunable antennas comprises one or more distributed ultra-small tunable antennas.

4. The tunable radio front end of claim 1, wherein one or more of the first tunable filter or the second tunable filter comprises one or more tunable interference and harmonic filters.

5. The tunable radio front end of claim 1, wherein one or more of the first tunable filter or the second tunable filter comprises one or more pole-zero elements.

6. The tunable radio front end of claim 1, further comprising at least one additional transmission signal path;
   wherein the transmission signal path is configured for transmission of signals within a first relatively lower frequency band; and
   wherein the at least one additional transmission signal path is configured for transmission of signals within a second relatively higher frequency band.

7. The tunable radio front end of claim 6, wherein the first relatively lower frequency band comprises a band of frequencies between about 600 and 1000 MHz; and
   wherein the second relatively higher frequency band comprises a band of frequencies between about 1700 and 3500 MHz.

8. The tunable radio front end of claim 1, further comprising at least one additional reception signal path;
   wherein the reception signal path is configured for reception of signals within a first relatively lower frequency band; and
   wherein the at least one additional reception signal path is configured for reception of signals within a second relatively higher frequency band.

9. The tunable radio front end of claim 8, wherein the first relatively lower frequency band comprises a band of frequencies between about 600 and 1000 MHz; and
   wherein the second relatively higher frequency band comprises a band of frequencies between about 1700 and 3500 MHz.

10. The tunable radio front end of claim 1, further comprising a sensing and control system in communication with each of the transmission signal path, the reception signal path, and the first and second tunable impedance matching networks for integrated sensing and control of the tunable radio front end frequency response.

11. A method for operating a radio frequency (RF) antenna, the method comprising:
    connecting a first tunable impedance matching network to a radio transmitter through a transmission signal path, the transmission signal path comprising a first tunable filter and a first tunable power amplifier;
    connecting a second tunable impedance matching network to a radio receiver through a reception signal path, the reception signal path comprising a second tunable filter and a first tunable low-noise amplifier;
    adjusting tuning settings of the first tunable impedance matching network, the first tunable filter, and the first tunable power amplifier to pass signals of a desired transmit frequency band from the radio transmitter and block signals of a desired receive frequency band; and
    adjusting tuning settings of the second tunable impedance matching network, the second tunable filter, and the first tunable low-noise amplifier to pass signals of the desired receive frequency band to the radio receiver and blocking signals of the desired transmit frequency band.

12. The method of claim 11, comprising:
    connecting the first tunable impedance matching network to at least one additional transmission signal path, the at least one additional transmission signal path comprising a third tunable filter and a second tunable power amplifier;
    adjusting tuning settings of the first tunable impedance matching network, the first tunable filter, and the first tunable power amplifier to transmit signals within a first transmission frequency band; and
    adjusting tuning settings of the first tunable impedance matching network, the first tunable filter, and the first tunable power amplifier to transmit signals within a second transmission frequency band that is different than the first transmission frequency band.

13. The method of claim 12, wherein the first transmission frequency band comprises a band of frequencies between about 600 and 1000 MHz; and
    wherein the second transmission frequency band comprises a band of frequencies between about 1700 and 3500 MHz.

14. The method of claim 11, comprising:
    connecting the second tunable impedance matching network to at least one additional reception signal path, the at least one additional reception signal path comprising a fourth tunable filter and a second tunable low-noise amplifier;

adjusting tuning settings of the second tunable impedance matching network, the second tunable filter, and the first tunable low-noise amplifier to receive signals within a first reception frequency band; and adjusting tuning settings of the second tunable impedance matching network, the fourth tunable filter, and the second tunable low-noise amplifier to receive signals within a second reception frequency band that is different than the first reception frequency band.

15. The method of claim 14, wherein the first reception frequency band comprises a band of frequencies between about 600 and 1000 MHz; and wherein the second reception frequency band comprises a band of frequencies between about 1700 and 3500 MHz.

* * * * *